US008253111B2

(12) United States Patent  
Yoshimuta

(10) Patent No.: US 8,253,111 B2  
(45) Date of Patent: Aug. 28, 2012

(54) X-RAY DIAGNOSTIC APPARATUS

(75) Inventor: Toshinori Yoshimuta, Takatsuki (JP)

(73) Assignee: Shimadzu Corporation, Kyoto (JP)

(\*) Notice: Subject to any disclaimer, the term of this patent is extended or adjusted under 35 U.S.C. 154(b) by 349 days.

(21) Appl. No.: 12/638,305

(22) Filed: Dec. 15, 2009

(65) Prior Publication Data

US 2011/0139992 A1 Jun. 16, 2011

(51) Int. Cl.
*G01T 1/24* (2006.01)
(52) U.S. Cl. ............................... 250/370.15; 250/370.02
(58) Field of Classification Search ............. 250/370.02, 250/370.15
See application file for complete search history.

(56) References Cited

U.S. PATENT DOCUMENTS

| 6,294,787 | B1* | 9/2001 | Schieferdecker et al. ..... 250/349 |
| 7,372,148 | B2* | 5/2008 | Im et al. ........................ 257/714 |
| 2004/0211908 | A1* | 10/2004 | Sato et al. ................ 250/370.09 |
| 2008/0101536 | A1* | 5/2008 | Sendai ............................ 378/22 |

\* cited by examiner

*Primary Examiner* — David Porta  
*Assistant Examiner* — Hugh H Maupin  
(74) *Attorney, Agent, or Firm* — Sughrue Mion, PLLC

(57) ABSTRACT

An imaging apparatus including a flow passage 51 formed inside a base substrate 5, an active matrix substrate 3 disposed relative to a surface of the base substrate 5, an amplifier circuit connected to the active matrix substrate, and a temperature-control heat transfer medium circulated through the flow passage 51 to remove heat generated in the amplifier circuit 4 and suppress a temperature change in a semiconductor layer 2.

6 Claims, 6 Drawing Sheets

X-RAY DIAGNOSTIC APPARATUS

BACKGROUND OF THE INVENTION

1. Field of the Invention

The present invention relates to an imaging apparatus for detecting an image in response to receiving radioactive rays such as X-rays, visible rays or infrared rays, more particularly to temperature control thereinside.

2. Description of the Background Art

FIG. 6 shows a conventional imaging apparatus.

A semiconductor layer 102 for converting an incident radioactive ray into charge information is vapor-deposited on an active matrix substrate 103 for reading the charge information. A bias electrode 119 is formed on the semiconductor layer 102. The active matrix substrate 103 is disposed on a front surface of a base substrate 105 through a buffer layer 118.

The charge information created through the semiconductor layer 102 is read by the active matrix substrate 103, and the read charge information is converted into a voltage by an amplifier circuit 104 mounted on a tape automated bonding (TAB) film 108 connected to the active matrix substrate 103. The converted voltage is converted into a digital signal by an image-signal processing circuit board 115.

Further, a power supply circuit board 111 is disposed on a rear surface of the base substrate 105 to supply various DC voltages produced through a DC-DC converter 112, to the active matrix substrate 103 and peripheral circuits thereof.

During operation, considerable heat is generated in the amplifier circuit 104, and the DC-DC converter 112 mounted to the power supply circuit board 111. Therefore, a heat pipe 151 is connected to a surface of each of the amplifier circuit 104 and the DC-DC converter 112 of the power supply circuit board 111 to discharge the generated heat so as to keep each of the amplifier circuit 104 and the DC-DC converter 112 at an approximately constant temperature (see, for example, JP 11-345956A).

However, the above conventional structure causes an increase in lateral width of the imaging apparatus, which constitutes a limiting factor of downsizing.

Further, in order to thermally stabilize the amplifier circuit 104, and a semiconductor device of the power supply circuit board 111, it is necessary to lay out the plurality of heat pipe 151 at respective positions, which leads to an increase in the number of components.

Moreover, the amplifier circuit 104 is located in adjacent relation to the semiconductor layer 102, which is likely to cause a temperature rise in the semiconductor layer 102. It is known that a material consisting mainly of amorphous selenium recrystallizes at 40° C. or more. Thus, if the amorphous selenium-based material is employed in the semiconductor layer 102, the temperature rise will pose a problem.

SUMMARY OF THE INVENTION

It is an object of the present invention to provide an imaging apparatus capable of thermally stabilizing a plurality of components, while minimizing the number of components.

In order to achieve this object, one aspect of the present invention provides an imaging apparatus which comprises a semiconductor layer for converting light or radioactive ray information into charge information, an active matrix substrate for reading the charge information, an amplifier circuit for amplifying and converting the read charge information into a voltage, and a base substrate internally provided with a flow passage, wherein the active matrix substrate is disposed relative to a front surface of the base substrate, and the amplifier circuit is disposed relative to a rear surface of the base substrate.

Preferably, in the imaging apparatus of the aspect of the present invention, a portion of the base substrate on the side of the rear surface thereof is partially concaved to have a thinned portion, and wherein the amplifier circuit is disposed relative to a rear surface of the thinned portion, and the flow passage is formed in the remaining portion of the base substrate other than the thinned portion. In the imaging apparatus having the amplifier circuit disposed relative to the rear surface of the thinned portion, it is preferable to provide heat-conducting means to extend between the amplifier circuit and the remaining portion of the base substrate. In the imaging apparatus having the heat-conducting means provided to extend between the amplifier circuit and the remaining portion of the base substrate, it is preferable to provide heat-insulating means between the amplifier circuit and the thinned portion of the base substrate.

When the above imaging apparatus further comprises a tape automated bonding (TAB) film connected to the active matrix substrate, the amplifier circuit is preferably mounted to the TAB film on an opposite side of the thinned portion of the base substrate with respect to the TAB film. In this case, it is preferable that the heat-insulating means is an elastic body.

The imaging apparatus of the aspect of the present invention may further comprise a power supply circuit board disposed relative to the remaining portion of the base substrate.

As above, in the imaging apparatus of the aspect of the present invention, the base substrate internally having the flow passage is interposed between the amplifier circuit and the semiconductor layer. Thus, heat is exchanged between the amplifier circuit and a medium flowing through the flow passage, through the base substrate. In other words, heat generated in the amplifier circuit is less likely to be conducted to the semiconductor layer. This makes it possible to suppress a the temperature rise in the semiconductor layer due to heat generated in the amplifier circuit. Further, heat is also exchanged between the semiconductor layer and the medium flowing through the flow passage. This makes it possible to suppress a temperature change in the semiconductor layer due to other factors, such as changes in environmental temperature. In addition, a need for providing thermally stabilizing means around the base substrate can be eliminated to facilitate space-saving.

In the above structure, the charge information is transmitted as a weak signal from the active matrix substrate to the amplifier circuit. If a length of a transmission line for the charge information becomes longer, external noise is more likely to be superimposed on the charge information.

In this regard, the amplifier circuit may be disposed relative to the rear surface of the thinned portion of the base substrate, so that the length of the transmission line between the active matrix substrate and the amplifier circuit can be effectively shortened. This makes it possible to reduce an influence of external noise.

In the structure where the amplifier circuit is disposed relative to the rear surface of the thinned portion, and the flow passage is formed in the remaining portion of the base substrate other than the thinned portion, the amplifier circuit is located closer to the semiconductor layer without interposing the flow passage therebetween. Thus, an amount of heat exchange between the amplifier circuit and the medium flowing through the flow passage, and an amount of heat exchange between the amplifier circuit and the semiconductor layer is increased.

In this regard, the heat-conducting means may be provided to extend between the amplifier circuit and the remaining portion of the base substrate, so that heat generated in the amplifier circuit can be conducted to a position adjacent to the flow passage through the heat-conducting means. This makes it possible to relatively reduce an amount of heat to be conducted to the semiconductor layer.

Additionally, the heat-insulating means may be provided between the amplifier circuit and the thinned portion of the base substrate. This makes it possible to further reduce the amount of heat to be conducted to the semiconductor layer.

In cases where a semiconductor device is mounted to the TAB film, a molding material is provided on a side opposite to a mounting surface of the TAB film. The molding material has a strength less than that of the semiconductor device. In this regard, when the imaging apparatus has a TAB film connected to the active matrix substrate, the amplifier circuit may be mounted to the TAB film on an opposite side of the thinned portion of the base substrate with respect to the TAB film. Thus, the semiconductor device having higher strength is oriented outwardly. This makes it possible to prevent the molding material from being damaged due to external pressure/shock or the like.

Further, the heat-insulating means provided between the amplifier circuit and the thinned portion of the base substrate may be formed as an elastic body. This makes it possible to prevent the molding material from being damaged due to interference with the thinned portion or the heat-insulating means.

The imaging apparatus may have an additional heat generation source typified by a power supply circuit board, other than the amplifier circuit, on a case-by-case basis. In this case, it is desirable to suppress heat exchange between the additional heat generation source and the semiconductor layer. In this regard, the power supply circuit board may be disposed relative to the remaining portion of the base substrate, so that the flow passage is interposed between the power supply circuit board and the semiconductor layer. This makes it possible to reduce an amount of heat exchange between the power supply circuit board and the semiconductor layer.

Differently from the amplifier circuit, even if a length of an interconnection line between the power supply circuit board and the active matrix substrate, it is not really necessary to consider an influence of external noise.

DESCRIPTION OF THE EXEMPLARY PREFERRED EMBODIMENTS

The present invention will now be described based on an exemplary embodiment thereof.

[First Exemplary Embodiment]

Figure 1A:
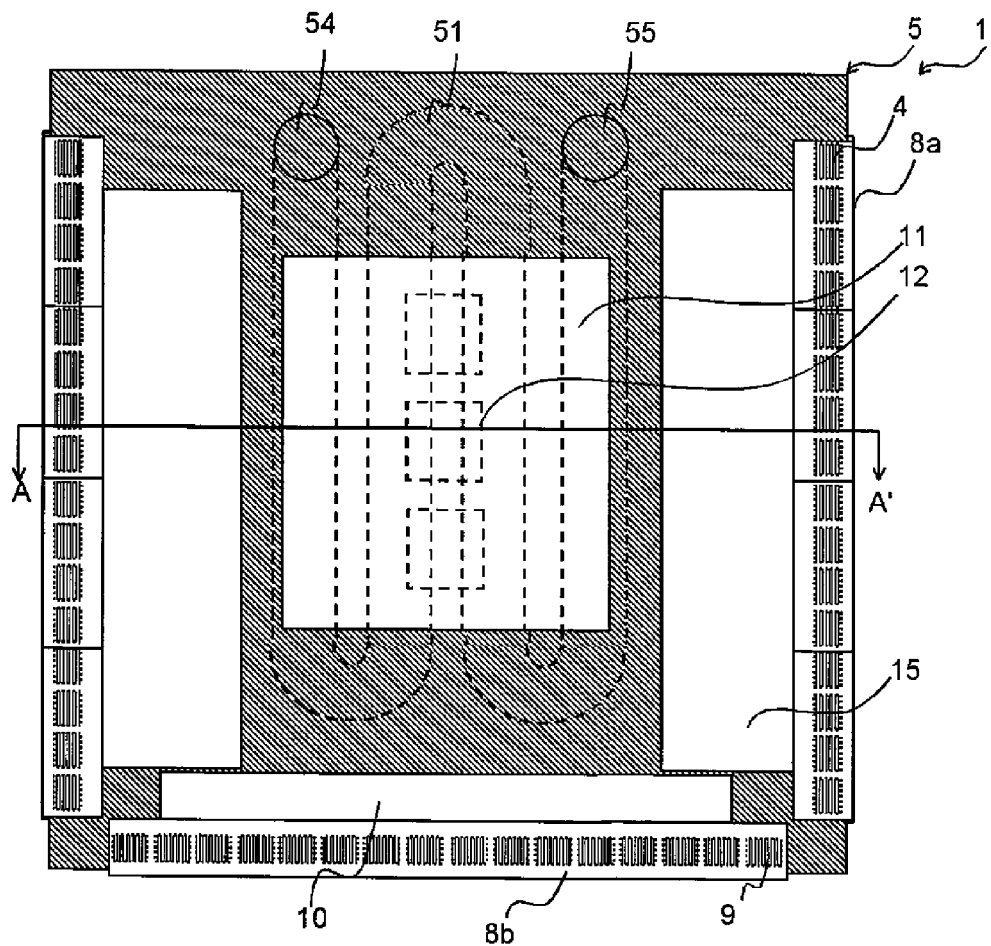
FIGS. 1A and 1B are explanatory diagrams showing an imaging apparatus according to a first exemplary embodiment of the present invention.
Figure 1B:
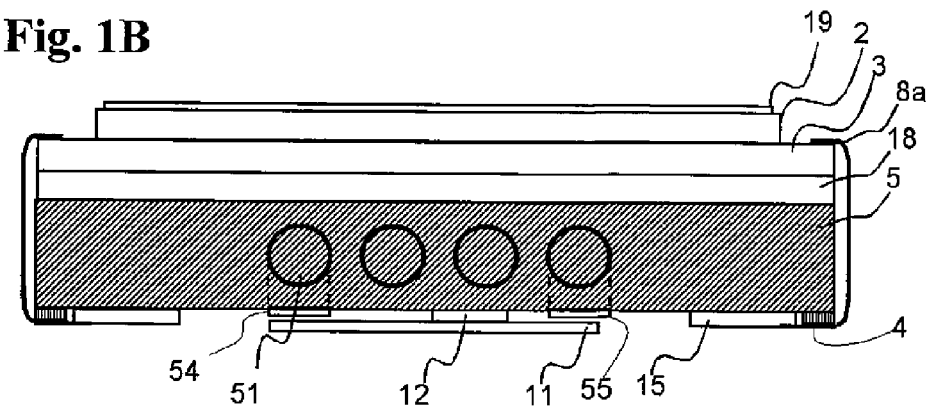

FIG. 1A is a diagram showing an imaging apparatus 1 according to a first exemplary embodiment of the present invention, when viewed from the side of a rear surface of the imaging apparatus 1 on an assumption that a radioactive ray incidence surface of the imaging apparatus 1 is defined as a front surface. FIG. 1B is a sectional view taken along the line A-A' in FIG. 1A.

As shown in FIG. 1B, an active matrix substrate 3 is disposed on a base substrate 5 internally having a copper pipe 51 serving as a flow passage, through a buffer layer 18.

The base substrate 5 is made of a material having a high thermal conductivity and a capability to achieve a rigidity greater than that of the active matrix substrate 3 even if it has a minimum thickness allowing the copper pipes 51 to be arranged thereinside in a required configuration. Specifically, the material is preferably aluminum or an alloy consisting primarily of aluminum. The "material having a high thermal conductivity" means a material having a thermal conductivity greater than that of air.

An example of the buffer layer 18 may include a gelatinous material comprising a resin, such as a silicon-based resin composition, as a primary component, or may be a resin plate material typified by an epoxy resin or an acrylic resin, or a cushioning material, such as sponge.

The buffer layer 18 may be omitted to have a structure where the active matrix substrate 3 directly contacts the base substrate 5. However, it is preferable to provide the buffer layer 18, in view of its capability to absorb a stress produced in the active matrix substrate 3 due to temperature changes or vibrations occurring when each of the base substrate 5 and the active matrix substrate 3 has a different thermal expansion coefficient. Further, the buffer layer 18 may be a type capable of reducing a thermal resistance between the base substrate 5 and the active matrix substrate 3 to shorten a time-period required for reaching a stable temperature.

The copper pipe 51 is embedded in the base substrate 5 by a conventional friction diffusion bonding technique. In this manner, a flow passage is formed by the copper pipe 51 having a thermal conductivity greater than that of the base substrate 5, and the copper pipe 51 is brought into close contact with the base substrate 5 by the friction diffusion bonding. Thus, heat can be efficiently exchanged between the base substrate 5 and a temperature-control heat transfer medium flowing through the flow passage.

The flow passage may be formed by other techniques. For example, a cavity may be simply formed inside the base substrate 5. In this case, the cavity also functions as the flow passage.

The copper pipe has opposite ends serving as a flow passage inlet 54 and a flow passage outlet 55 each protruding from a rear surface of the base substrate, and a tube (not shown) for circulating the temperature-control heat transfer medium is connected to each of the flow passage inlet 54 and the flow passage outlet 55. A liquid circulation unit (not shown) is connected to the tube. The liquid circulation unit is operable to circulate the heat transfer medium kept at a constant temperature.

As used herein, the term "kept at a constant temperature" means to allow a temperature of the heat transfer medium to be kept approximately constant at any position of a circulation flow passage including the liquid circulation unit.

In the first embodiment, the temperature-control heat transfer medium is kept at a constant temperature, as described above. For example, a temperature sensor may be provided at an appropriate position in the imaging apparatus to control the temperature of the liquid heat transfer medium in such a manner that a temperature measured by the temperature sensor is kept approximately constant. This configuration can be achieved by a conventional feedback control.

A semiconductor layer 2 is laminated on the active matrix substrate 3 to convert an incident radioactive ray into electric charges. The semiconductor layer 2 is formed by vapor-depositing a thick semiconductor film consisting primarily of amorphous selenium, on the active matrix substrate 3.

In this regard, the semiconductor layer 2 may be made of any other suitable material and formed by any other suitable method. For example, CsI, CdZnTe or CdTe may be selected as a material of the semiconductor layer 2. Further, the imaging apparatus may be a type configured to convert a radioactive ray into light and then convert the light into charge information by a photodiode (indirect-conversion type). In other words, the exemplary embodiment of the present invention may be applied to any semiconductor layer whose performance is likely to be affected by temperature changes in use environment or various heat sources incorporated in the imaging apparatus.

A bias electrode 19 is formed on the semiconductor layer 2 to supply a bias voltage.

In the above structure, an additional layer may be interposed between respective ones of the active matrix substrate 3, the semiconductor layer 2 and the bias electrode 19. For example, the exemplary embodiment of the present invention may be applied to a structure where a blocking layer is provided on one or each of opposite surfaces of the semiconductor layer 2 to reduce a dark current.

The active matrix substrate 3 and various circuits connected to the active matrix substrate 3 will be described below.

Figure 2:
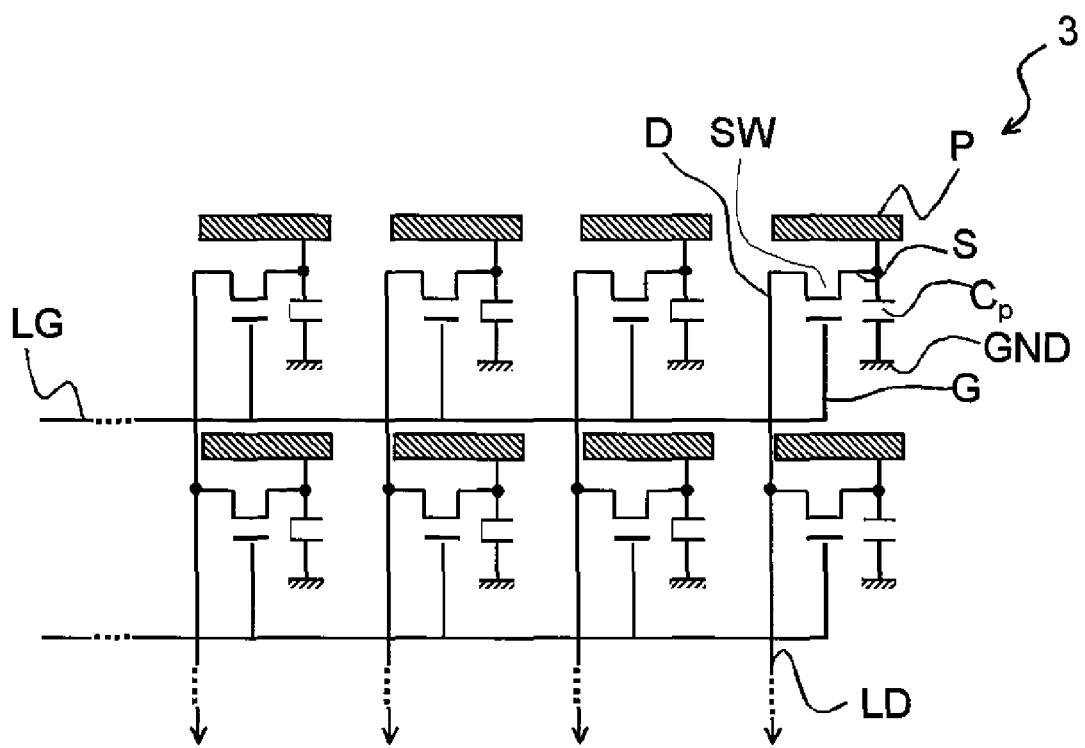
FIG. 2 is an explanatory diagram showing an internal structure of an active matrix substrate.

As shown in FIG. 2, the active matrix substrate 3 has a plurality of pixel electrodes P and a plurality of switching elements SW, which are arranged in a matrix pattern. Each of the pixel electrodes P is connected to a corresponding one of the switching elements SW, and forms a capacitance Cp in association with a dielectric layer provided between the pixel electrode P and a ground electrode GND. The capacitance Cp is operable to accumulate electric charges collected from the pixel electrode P.

The active matrix substrate 3 also has the same number of gate lines LG as that of rows, and the same number of data lines LD as that of columns, wherein each of the gate lines LG is connected to respective gate terminals G of the switching elements SW belonging to the same row, and each of the data lines LD is connected to respective drain terminals D of the switching elements SW belonging to the same column.

The data lines LD are connected to respective ones of a plurality of amplifier circuits 4 through a TAB film 8a illustrated in FIG. 1. The amplifier circuits 4 are further connected to an image-signal processing circuit board 15 through the TAB film 8a. Similarly, the gate lines LG are connected to respective ones of a plurality of gate drive circuits 9 through a TAB film 8b. The gate drive circuits 9 are further connected to a gate control circuit 10.

In the first embodiment, the TAB film 8a is used for connecting the active matrix substrate 3 to the amplifier circuits 4. Alternatively, any other means capable of transmitting a charge signal may be used. For example, a simple flat cable may be used to connect the active matrix substrate 3 to a board provided with the amplifier circuits 4.

Each of the gate drive circuits 9 is operable to activate a corresponding one of the gate lines LG selected by the gate control circuit 10. Upon activation of the selected gate line, the switching elements SW connected to the activated gate line are turned on. Thus, electric charges accumulated in the capacitances Cp flow in the data lines LD through the switching elements SW.

Each of the amplifier circuit 4 is operable to amplify and convert the electric charges flowing in a corresponding one of the data lines LD, into a voltage. The converted voltage is read into the image-signal processing circuit board 15 in a sequential manner, and converted into a digital value by the image-signal processing circuit board 15.

The above series of operations are performed while sequentially scanning the driven gate lines LG, to allow digital values corresponding to charge information about all pixels to be acquired. Based on the acquired digital values, an X-ray image can be obtained.

The amplifier circuits 4 and the image-signal processing circuit board 15 are disposed relative to the rear surface of the base substrate 5. In the first embodiment, each of the amplifier circuits 4 having large heat generation is disposed in close contact with the rear surface of the base substrate 5. Thus, as compared with an arrangement where the amplifier circuit 4 is disposed relative to a lateral surface of the base substrate 5, a distance between the semiconductor layer 2 and the amplifier circuit 4 can be increased. This makes it possible to prevent the semiconductor layer 2 from degrading due to heat generated in the amplifier circuit 4. In addition, the amplifier circuit 4 disposed at a position other than the lateral surface of the base substrate 5 allows the overall size of the imaging apparatus 1 to be reduced.

Further, heat is exchanged between the amplifier circuit 4 and the temperature-control heat transfer medium passing through the copper pipe 51, through the base substrate 5, so that a surface temperature of the amplifier circuit 4 can be kept approximately at a temperature of the fluid medium to suppress a characteristics change due to a temperature change in the amplifier circuit 4.

In cases where a device having large heat generation or a device susceptible to a temperature change is mounted on the image-signal processing circuit board 15, it is desirable to thermally connect such a device to the base substrate 5.

In the first embodiment, each of the gate drive circuits 9 is disposed in contact with the rear surface of the base substrate 5, as with the amplifier circuits 4. The gate drive circuit 9 has only a function of turning on/off a gate voltage to be supplied to the switching elements, and therefore a temperature rise in the gate drive circuit 9 has an insignificant impact on characteristics thereof. However, as compared with an arrangement where the gate drive circuit 9 is disposed relative to the lateral surface of the base substrate 5, a distance between the semiconductor layer 2 and the gate drive circuit 9 can be increased. This makes it possible to prevent the semiconductor layer 2 from degrading due to heat generated in the gate drive circuit 9. In addition, the gate drive circuit 9 disposed at a position other than the lateral surface of the base substrate 5 allows the overall size of the imaging apparatus 1 to be reduced.

However, the above arrangement of the gate drive circuit 9 is not essential to the present invention.

In FIG. 1, a pair of combinations each consisting of the TAB film 8a, the amplifier circuits 4 and the image-signal processing circuit board 15 are arranged in a bilaterally symmetrical manner, and therefore a reference code for each of the left TAB film, the left amplifier circuits and the left image-signal processing circuit board is omitted. Further, only an uppermost one of the right amplifier circuits mounted on the TAB film 8a is indicated by the reference code 4, and the reference code for the remaining right amplifier circuits is omitted. Similarly, only a rightmost one of the gate drive circuits is indicated by the reference code 9, and the reference code for the remaining gate drive circuits is omitted.

A pair of combinations each consisting of the TAB film 8a, the amplifier circuits 4 and the image-signal processing circuit board 15 are arranged in a bilaterally symmetrical manner, as mentioned above. This arrangement is intended to divide a detection area into right and left detection areas and simultaneously read charge information from the right and left detection areas. Thus, a plurality of amplifier circuits 4 and an image-signal processing circuit board 15 for the entire detection area may be arranged on only one side of the imaging apparatus. However, in the laterally divided arrangement, a plurality of heat sources can be distributedly arranged to reduce a negative influence on the semiconductor layer 2 due to a local temperature rise.

As shown in FIG. 1, a power supply circuit board 11 is disposed relative to the rear surface of the base substrate 5, and a DC-DC converter 12 is mounted on the power supply circuit board 11. The DC-DC converter 12 is disposed in contact with the base substrate 5 to allow heat generated during an operation of the DC-DC converter 12 to be readily removed by the base substrate 5.

The DC-DC converter 12 is not necessarily disposed in contact with the base substrate 5, but may be connected to the base substrate 5 through a member having a high thermal conductivity. Although the DC-DC converter 12 is shown as an example of a device mounted to the power supply circuit board 11, the same arrangement may be applied to other device. The arrangement where the power supply circuit board 11 is disposed relative to the rear surface of the base substrate 5 is not essential to the present invention.

[Second Exemplary Embodiment]

Figure 3A:
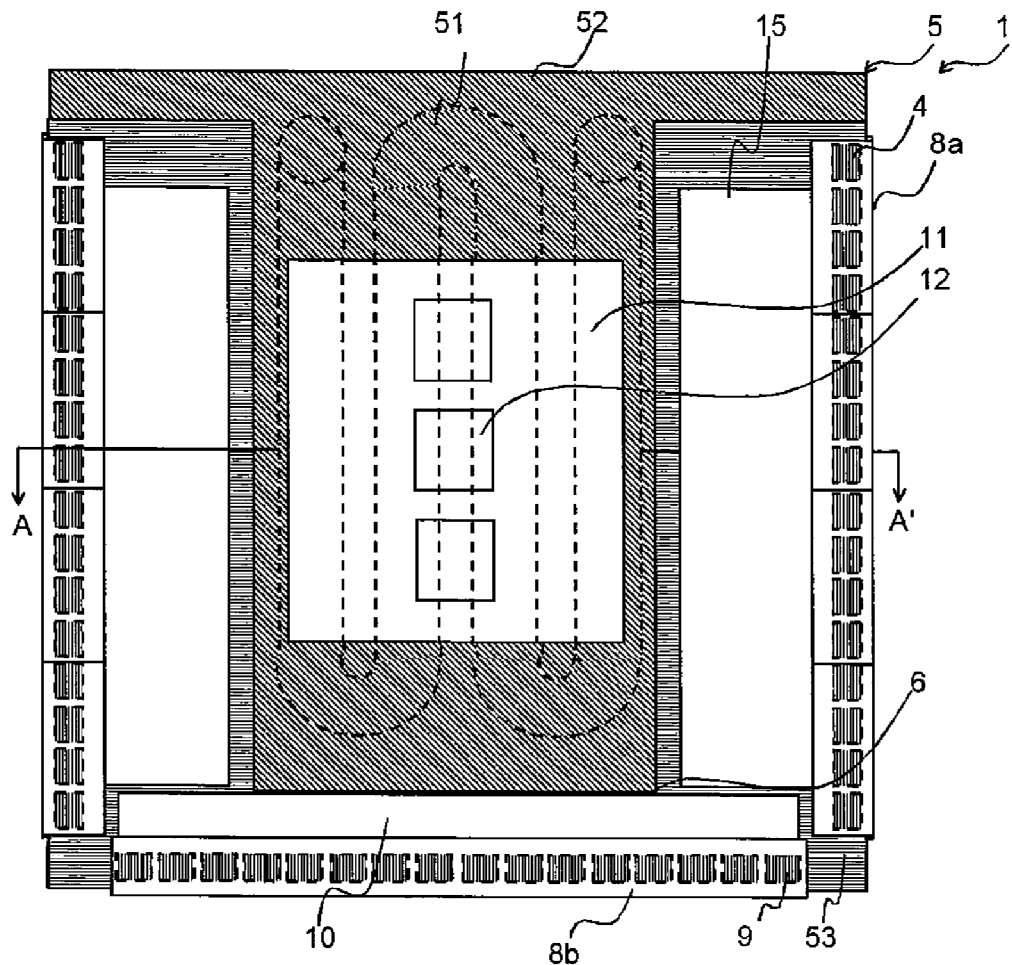
FIGS. 3A and 3B are explanatory diagrams showing an imaging apparatus according to a second exemplary embodiment of the present invention.
Figure 3B:
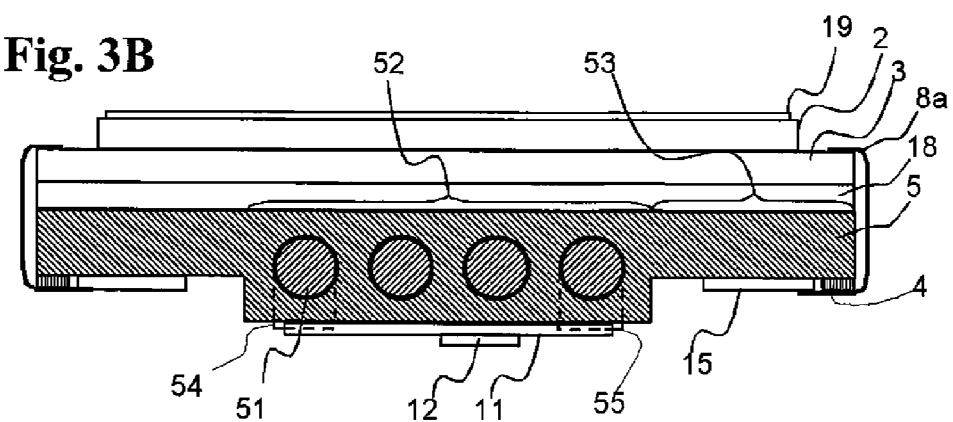

FIG. 3A is a diagram showing an imaging apparatus 1 according to a second exemplary embodiment of the present invention, when viewed from the side of a rear surface of the imaging apparatus 1 on an assumption that a radioactive ray incidence surface of the imaging apparatus 1 is defined as a front surface. FIG. 3B is a sectional view taken along the line A-A' in FIG. 3A. The second embodiment is structurally different from the first embodiment, only in that a portion of the base substrate 5 on the side of the rear surface thereof is partially concaved to have a thinned portion 53, and the amplifier circuits 4 and others are disposed relative to a rear surface of the thinned portion 53 so as to reduce a length of the TAB film (8a, 8b). Thus, a description of the remaining structure will be omitted.

As shown in FIGS. 3A and 3B, a portion of a base substrate 5 on the side of a rear surface thereof is partially concaved to have a thinned portion 53. In the second embodiment, the thinned portion 53 is formed along right, left and lower edges of the base substrate 5. A plurality of amplifier circuits and an image-signal processing circuit board 15 are disposed relative to a rear surface of a region of the thinned portion 53 formed along each of the right and left edges of the base substrate 5. A plurality of gate drive circuits 9 and a gate control circuit 10 are disposed relative to a rear surface of a region of the thinned portion 53 formed along the lower edge of the base substrate 5. Thus, a length of a TAB film (8a, 8b) can be reduced in proportion to a reduction in thickness of the thinned portion 53.

A copper pipe 51 serving as a flow passage is disposed in the remaining portion 52 of the base substrate 5 other than the thinned portion 53. The reason is that, if the flow passage is formed in the thinned portion 53, the thinned portion 53 is required to have a thickness greater than a diameter of the copper pipe 51, which makes it impossible to thin the base substrate 5.

As described in the first embodiment, a charge signal is transmitted from an active matrix substrate 3 to the amplifier circuits 4 through the TAB film 8a. The charge signal to be transmitted is extremely weak, and thereby susceptible to environmental noise. In the second embodiment, a transmission distance of electric charges can be shortened as compared with the first embodiment, which makes it possible to reduce an influence of environmental noise.

An intensity of a signal to be transmitted from the gate drive circuit 9 and the gate control circuit 10 to the active matrix substrate 3 is relatively high, and therefore insusceptible to environmental noise. Therefore, it is not essential to form the thinned portion 53 along the lower edge of the base substrate 5 so as to allow the gate drive circuits 9 and the gate control circuit 10 to be disposed relative to the rear surface of the lower edge region. However, the structure/arrangement of the second embodiment allows respective lengths of the TAB films 8a, 8b to be equalized. Thus, it can be expected to achieve a reduction in production cost based on component commonization.

[Third Exemplary Embodiment]

Figure 4A:
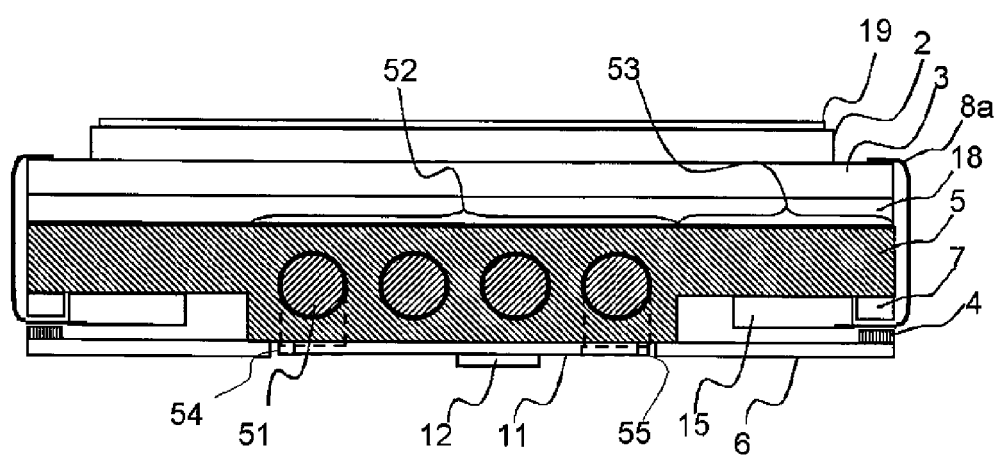
FIGS. 4A and 4B are explanatory diagrams showing an imaging apparatus according to a third exemplary embodiment of the present invention.

FIG. 4A is a sectional view of an imaging apparatus 1 according to a third exemplary embodiment of the present invention. The following description will be made about only a difference from the second embodiment.

Figure 4B:
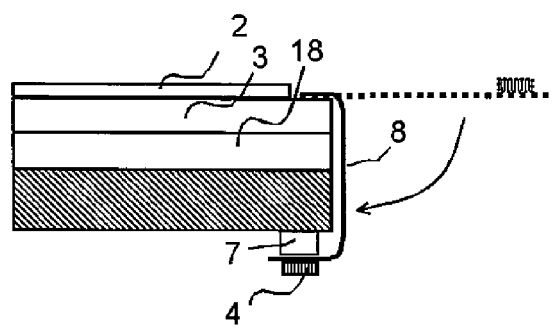

As shown in FIG. 4A, a mounting surface of the TAB film 8a for each of the amplifier circuits 4 is reversed with respect to that in the first and second embodiment. Specifically, as shown in FIG. 4B, after mounting the amplifier circuit 4 on the TAB film 8a, the TAB film 8a in a stretched state is connected to an end of the active matrix substrate 3 in such a manner that the amplifier circuit 4 is oriented upwardly in FIG. 4B, and then bent to face the rear surface of the base substrate 5. In this state, the amplifier circuit 4 is mounted to the TAB film 8a to be located on an opposite side of the rear surface (of the thinned portion 53) of the base substrate 5 with respect to the TAB film 8a.

Figure 5A:
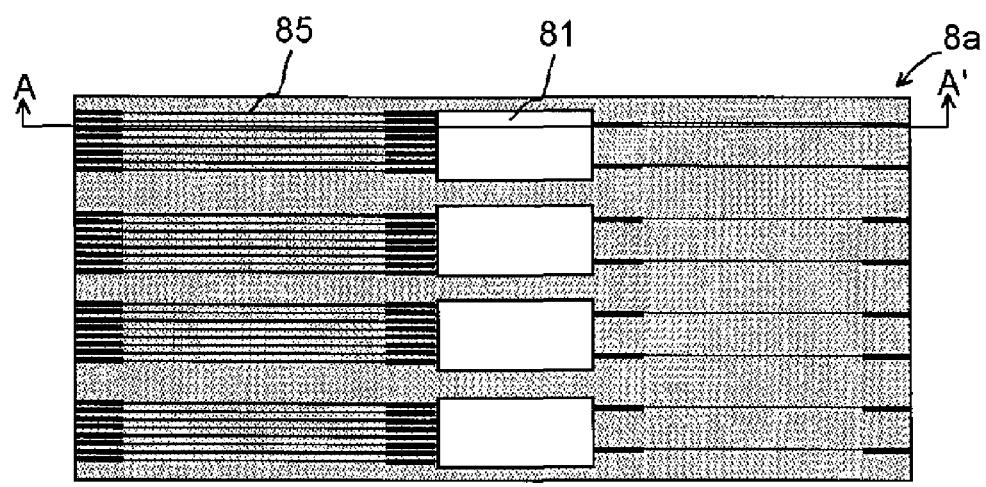
FIGS. 5A to 5C are explanatory diagrams showing an operation of mounting a device to a TAB film.
Figure 5B:
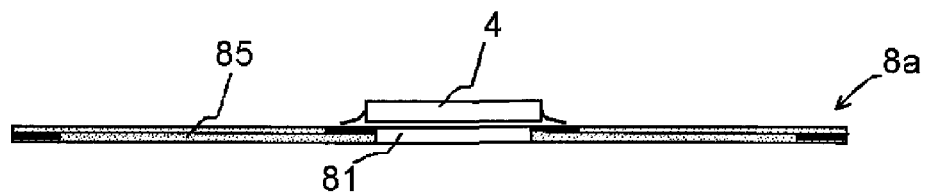
Figure 5C:
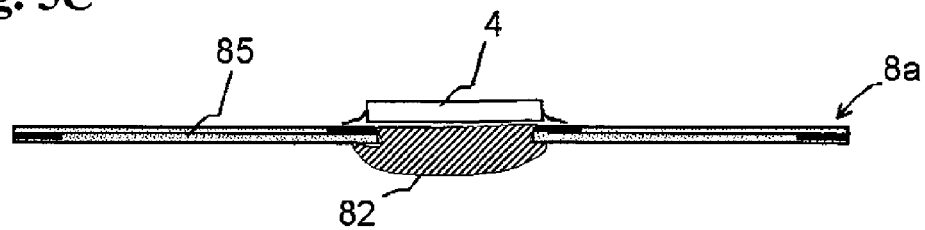
Figure 6:
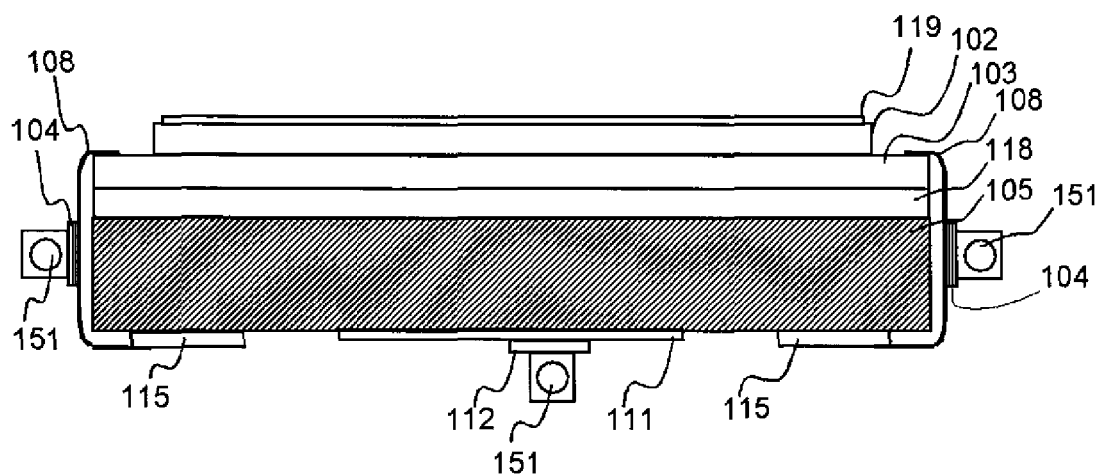
FIG. 6 is an explanatory diagram showing a conventional two-dimensional imaging apparatus.

With reference to FIGS. 5A to 5B, a mounting portion for the amplifier circuit 4 will be more specifically described.

FIG. 5A is a top plan view of the TAB film 8a. The TAB film 8a is formed with a plurality of device-mounting holes 81. The TAB film 8a is internally provided with a plurality of electrodes 85. Each of the electrodes 85 is exposed to the outside only at opposite edges of the TAB film 8a and at opposite peripheral portions of a corresponding one of the holes 81.

As shown in FIG. 5B which is a sectional view taken along the line A-A' in FIG. 5A, one of the amplifier circuits 4 to be mounted is placed on one of the holes 81, and a leg of the amplifier circuit 4 is thermally pressure-bonded to the exposed portion of the electrode 85. Then, a molding material 82 is supplied from a side opposite to the mounting surface to fill the hole 81.

In view of current technical levels, the molding material 82 is relatively easily broken due to pressure or shock applied thereto. Thus, it is undesirable to mount the amplifier circuit 4 in such a manner that a surface of the TAB film 8a formed with the molding material 82 is oriented outwardly. Therefore, in the third embodiment, the TAB film 8a is mounted to allow the surface formed with the molding material 82 to be oriented inwardly. This makes it possible to prevent the molding material 82 from being damaged due to external shock or the like.

However, if the TAB film 8a is simply arranged in the above manner, the amplifier circuit 4 is not disposed in contact with the base substrate 5. Therefore, heat-conducting means 6 is provided to thermally bypass between the amplifier circuit 4 and the remaining portion 52 of the base substrate 5 other than the thinned portion.

Preferably, the heat-conducting means 6 is comprised of a graphite sheet or a copper plate having a high thermal conductivity. Nonetheless, the heat-conducting means 6 may be made of any other suitable material or may be formed in any other suitable shape, as long as it has a thermal conductivity equal to or greater than that of the base substrate 5.

Thus, heat can be exchanged between the amplifier circuit 4 and the temperature-control heat transfer medium passing through the copper pipe 51, through the heat-conducting means 6 and the base substrate 5. Further, the copper pipe 51 serving as a flow passage is provided inside the remaining portion 52 of the base substrate 5, and the amplifier circuit 4 is thermally connected to the remaining portion 52 of the base substrate 5 through the heat-conducting means 6. Thus, as compared with the second embodiment, heat can be efficiently exchanged between the amplifier circuit 4 and the heat transfer medium passing through the flow passage. In the second embodiment, a certain level of heat exchange occurs between the amplifier circuit 4 and the semiconductor layer 2 through the thinned portion 53 devoid of the flow channel. In contract, the third embodiment can eliminate such a negative effect. A sponge 7 serving as heat-insulating means may be additionally disposed between the amplifier circuit 4 (the molding material 82) and the thinned portion 53 to reliably eliminate the negative effect.

The sponge 7 serving as heat-insulating means has elasticity. Thus, the sponge 7 also serves as a means to protect the molding material 82 from shock.

In the third embodiment, the sponge 7 serving as heat-insulating means is disposed between the amplifier circuit 4 (the molding material 82) and the thinned portion 53. However, the heat-insulating means is not essential to the present invention. Further, the heat-insulating means is not limited to a type having elasticity. As used herein, the term "heat-insulating means" means a material having a thermal conductivity at least equal to or less than that of air. Further, the term "elasticity" means an ability to, when a maximum allowable shock specified in product specifications is applied to the imaging apparatus, absorb the shock at a level enough to keep from damaging the molding material 82.

What is claimed is:

1. An imaging apparatus comprising:
a semiconductor layer for converting light or radioactive ray information into charge information;
an active matrix substrate for reading the charge information;
an amplifier circuit connected to the active matrix substrate to amplify and convert the read charge information into a voltage; and
a base substrate internally provided with a flow passage for allowing a temperature-control heat transfer medium to pass therethrough, wherein the active matrix substrate is disposed relative to a front surface of the base substrate, and the amplifier circuit is disposed relative to a rear surface of the base substrate,
wherein a portion of the base substrate on the side of the rear surface thereof is partially concaved to have a thinned portion, and wherein the amplifier circuit is disposed relative to a rear surface of the thinned portion, and the flow passage is formed in the remaining portion of the base substrate other than the thinned portion;
heat-conducting means provided to extend between the amplifier circuit and the remaining portion of the base substrate; and
heat-insulating means provided between the amplifier circuit and the thinned portion of the base substrate.

2. The imaging apparatus as defined in claim 1, which further comprises a tape automated bonding (TAB) film connected to the active matrix substrate, and wherein the amplifier circuit is mounted to the TAB film on an opposite side of the thinned portion of the base substrate with respect to the TAB film.

3. The imaging apparatus as defined in claim 1, wherein the heat-insulating means is an elastic body.

4. The imaging apparatus as defined in claim 1, which further comprises a power supply circuit board disposed relative to the remaining portion of the base substrate.

5. The imaging apparatus as defined in claim 2, which further comprises a power supply circuit board disposed relative to the remaining portion of the base substrate.

6. The imaging apparatus as defined in claim 3, which further comprises a power supply circuit board disposed relative to the remaining portion of the base substrate.

* * * * *